United States Patent
Graves et al.

(10) Patent No.: US 11,615,827 B2
(45) Date of Patent: Mar. 28, 2023

(54) HARDWARE ACCELERATOR WITH ANALOG-CONTENT ADDRESSABLE MEMORY (A-CAM) FOR DECISION TREE COMPUTATION

(71) Applicant: HEWLETT PACKARD ENTERPRISE DEVELOPMENT LP, Houston, TX (US)

(72) Inventors: Catherine Graves, Milpitas, CA (US); Can Li, Palo Alto, CA (US); Kivanc Ozonat, Palo Alto, CA (US); John Paul Strachan, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/071,924

(22) Filed: Oct. 15, 2020

(65) Prior Publication Data
US 2022/0122646 A1 Apr. 21, 2022

(51) Int. Cl.
*G11C 15/04* (2006.01)
*G11C 11/00* (2006.01)
(Continued)

(52) U.S. Cl.
CPC .......... *G11C 11/005* (2013.01); *G06F 9/3877* (2013.01); *G11C 11/06057* (2013.01); *G11C 11/4125* (2013.01)

(58) Field of Classification Search
CPC ............ G11C 11/005; G11C 11/06057; G11C 11/4125; G11C 15/00; G11C 15/04; G06F 9/3877
See application file for complete search history.

(56) References Cited

U.S. PATENT DOCUMENTS 6,288,922 B1 9/2001 Wong et al.
6,442,090 B1 8/2002 Ahmed et al.
(Continued)

FOREIGN PATENT DOCUMENTS

CN 109637571 A 4/2019
CN 110191135 A 8/2019

OTHER PUBLICATIONS

Bandi, N. et al., "Hardware Acceleration of Database Operations Using Content-Addressable Memories," Proceedings of the First International Workshop on Data Management on New Hardware (DaMoN 2005); Jun. 12, 2005, https://dl.acm.org/doi/pdf/10.1145/1114252.1114262.
(Continued)

*Primary Examiner* — Tuan T Nguyen
(74) *Attorney, Agent, or Firm* — Hewlett Packard Enterprise Patent Department

(57) ABSTRACT

Examples described herein relate to a decision tree computation system in which a hardware accelerator for a decision tree is implemented in the form of an analog Content Addressable Memory (a-CAM) array. The hardware accelerator accesses a decision tree. The decision tree comprises of multiple paths and each path of the multiple paths includes a set of nodes. Each node of the decision tree is associated with a feature variable of multiple feature variables of the decision tree. The hardware accelerator combines multiple nodes among the set of nodes with a same feature variable into a combined single node. Wildcard values are replaced for feature variables not being evaluated in each path. Each combined single node associated with each feature variable is mapped to a corresponding column in the a-CAM array and the multiple paths of the decision tree to rows of the a-CAM array.

16 Claims, 7 Drawing Sheets

(51) Int. Cl.
  *G06F 9/38* (2018.01)
  *G11C 11/06* (2006.01)
  *G11C 11/412* (2006.01)

(56) References Cited

U.S. PATENT DOCUMENTS

| | | | |
|---|---|---|---|
| 6,985,372 B1* | 1/2006 | Blyth | G11C 15/046 |
| | | | 365/45 |
| 7,050,317 B1 | 5/2006 | Lien et al. | |
| 7,206,212 B1 | 4/2007 | Chou | |
| 7,272,684 B1 | 9/2007 | Chou | |
| 7,554,844 B2 | 6/2009 | Werner et al. | |
| 7,899,978 B2 | 3/2011 | Pandya | |
| 8,165,924 B2 | 4/2012 | Smyers et al. | |
| 8,654,555 B2 | 2/2014 | Shin et al. | |
| 9,543,013 B1 | 1/2017 | Govindaraj et al. | |
| 9,613,701 B2 | 4/2017 | Roy | |
| 9,721,661 B1 | 8/2017 | Buchanan et al. | |
| 10,051,093 B2 | 8/2018 | Guo et al. | |
| 10,340,007 B2 | 7/2019 | Salama et al. | |
| 10,896,731 B1* | 1/2021 | Li | G11C 15/046 |
| 10,998,047 B1* | 5/2021 | Li | G11C 15/00 |
| 2005/0169095 A1 | 8/2005 | Bedeschi et al. | |
| 2013/0054886 A1 | 2/2013 | Eshraghian et al. | |
| 2014/0092664 A1 | 4/2014 | Bourianoff et al. | |
| 2016/0284408 A1 | 9/2016 | Chiou et al. | |
| 2017/0060438 A1 | 3/2017 | Igaue et al. | |
| 2018/0040374 A1 | 2/2018 | Zheng et al. | |
| 2020/0075099 A1 | 3/2020 | Choi et al. | |
| 2020/0258587 A1 | 8/2020 | Li et al. | |
| 2022/0122646 A1* | 4/2022 | Graves | G11C 11/4125 |
| 2022/0138204 A1* | 5/2022 | Graves | G06F 1/3206 |
| | | | 707/694 |

OTHER PUBLICATIONS

Bu, L. et al., "A Keyword Match Processor Architecture using Content Addressable Memory," Proceedings of the 14th ACM Great Lakes symposium on VLSI, Apr. 26-28, 2004, pp. 372-376, https://dl.acm.org/doi/pdf/10.1145/988952.989042.

Chiao-Ying Huang, "Ternary Content-addressable Memory Circuits," Midterm Report—IEE5009: Memory System, Institute of Electronics, National Chiao-Tung University, Fall 2012, pp. 1-7.

Harada et al., "A Content-addressable Memory Using "Switched Diffusion Analog Memory with Feedback Circuit"," IEICE Trans. Fundamentals, vol. E82-A, No. 2, Feb. 1999, pp. 370-377.

Rusch et al., "The Design of an Analog Associative Memory Circuit for Applications in High-dimensional Computing," Technical Report No. UCB/EECS-2018-72, University of California, May 18, 2018, 28 pages.

Bahloul, A et al., "Hardware Emulation of Memristor Based Ternary Content Addressable Memory," 2017 14th International Multi-Conference on Systems, Signals & Devices (SSD), Dec. 13, 2017, https://repository.kaust.edu.sa/handle/10754/626429.

Guo, Q. et., "A Resistive TCAM Accelerator for Data-Intensive Computing," MICRO-44: Proceedings of the 44th Annual IEEE/ACM International Symposium on Microarchitecture, Dec. 3-7, 2011, pp. 339-350, https://www.researchgate.net/publication/254007496_A_resistive_TCAM_accelerator_for_data-intensive_computing.

Han, R. et al., "A Novel Ternary Content Addressable Memory Design Based On Resistive Random Access Memory With High Intensity And Low Search Energy," Japanese Journal of Applied Physics, Apr. 2018, vol. 57, No. 4S, https://www.rescarchgate.net/publication/323327068_A_novel_ternary_content_addressable_memory_design_based_on_resistive_random_access_memory_with_high_intensity_and_low_search_energy.

Li, S. et al., "NVSim-CAM: A Circuit-Level Simulator for Emerging Nonvolatile Memory based Content-Addressable Memory," 2016 IEEE/ACM International Conference on Computer-Aided Design (ICCAD), Nov. 7, 2016, https://ieeexplore.ieee.org/document/7827579.

Lin, X. et al., "Random Forest Architectures on FPGA for Multiple Applications," GLSVLSI '17: Proceedings of the on Great Lakes Symposium on VLSI 2017, May 10-12, 2017, pp. 415-418, https://dl.acm.org/doi/10.1145/3060403.3060416.

Shen, R. et al., "A Hybrid TCAM + SRAM Scheme for Multi-Match Packet Classification," 2012 13th International Conference on Parallel and Distributed Computing, Applications and Technologies, Dec. 14-16, 2012, https://ieeexplore.ieee.org/document/6589360.

Zhao, L. et al., "RFAcc: A 3D ReRAM Associative Array based Random Forest Accelerator," International Conference on Supercomputing (ICS '19), Jun. 26-28, 2019, http://people.cs.pitt.edu/~leizhao/publications/ICS2019.pdf.

Lucchese et al., "QuickScorer: A Fast Algorithm to Rank Documents with Additive Ensembles of Regression Trees," Proceedings of the 38th International ACM SIGIR Conference on Research and Development in Information Retrieval, Aug. 2015 pp. 73-82.

Lucchese, C. et al., "QuickScorer: A Fast Algorithm to Rank Documents with Additive Ensembles of Regression Trees," Proceedings of the 38th Int'l ACM SIGIR Conference on Research & Development in Information Retrieval, Aug. 2015, pp. 73-82.

Li et al., "Analog content addressable memories with memristors", Nature communications, 2020, 22 pages.

Li et al., "Analog content-addressable memories with memristors", Nature Communications, 2020, 8 pages.

* cited by examiner

HARDWARE ACCELERATOR WITH ANALOG-CONTENT ADDRESSABLE MEMORY (A-CAM) FOR DECISION TREE COMPUTATION

BACKGROUND

Content addressable memory ("CAM") is a type of computing memory in which the stored data is not accessed by its location but rather by its content. A "word", or "tag", is input to the CAM, the CAM searches for the tag in its contents and, when found, the CAM returns the address of the location where the found contents reside.

Hardware of the CAM supports comparison of an input pattern with data stored in CAM cells. The memory that stores the data in the CAM also performs the search or compare operation at the same location, eliminating the expensive data transfer between different units in conventional hardware.

BRIEF DESCRIPTION OF THE DRAWINGS

The drawings provide examples and/or implementations consistent with the description; however, the description is not limited to the examples and/or implementations provided in the drawings.

DETAILED DESCRIPTION

Figure 1:
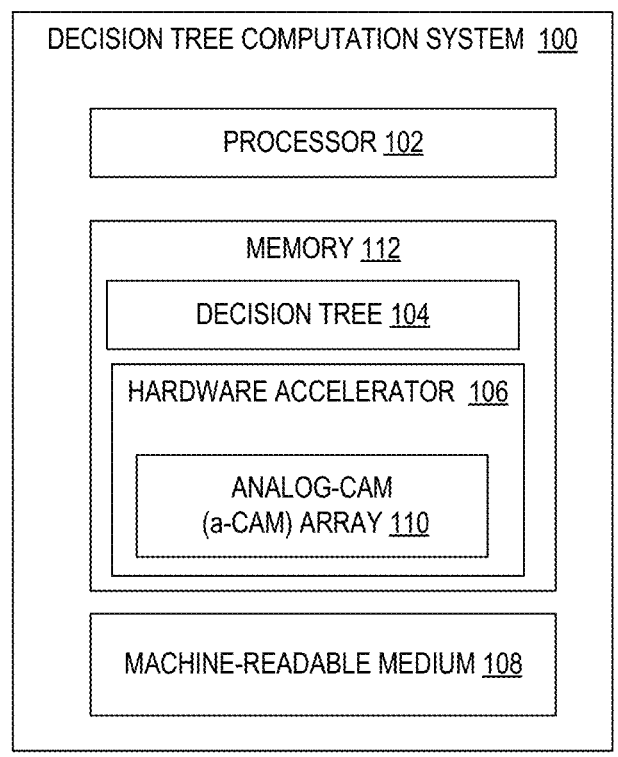
FIG. 1 illustrates a decision tree computation system in accordance with examples of the present disclosure.

The following detailed description refers to the accompanying drawings. Wherever possible, similar reference numbers are used in the drawings and the following description to refer to the same or similar parts. It is to be expressly understood, however, that the drawings are for the purpose of illustration and description only. While several examples are described in this document, modifications, adaptations, and other implementations are possible. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. As used herein, the term "includes" means includes but not limited to, the term "including" means including but not limited to. The term "based on" means based at least in part on.

Machine learning approaches in some applications require domain knowledge and historical expertise. Examples of such domains includes, tracking of multiple targets in surveillance, robotics, cybersecurity systems, decision making, situational intelligence with multimodal inputs (medical, autonomous driving systems), global system modelling (ground water models, smart factories, robotic/AUV fleet deployments) for risk/failure assessments, and predictive maintenance. Implementing a neural network for these applications may be difficult as training data in these domains may be limited and these domains may require critical decision making. With growing computation power allowing training of tree-based ensemble methods, several applications may use ensemble models for decision making.

Ensemble tree-based models are a machine learning approach for classification, prediction, regression and recommendation tasks across diverse applications. The ensemble tree-based models are easy to train, work well with smaller data sets and can accommodate missing data. In addition, the ensemble tree-based model may maintain reasonable interpretability for domain experts to verify and understand. A digital Content Addressable Memory (CAM), as described herein is implemented using Static Random Access Memory (SRAM) cells or memristor based technologies. During search of an input pattern, SRAM cells may be operated in parallel, which leads to massive throughput with applications in real-time network traffic monitoring, access control lists ("ACL"), associative memories, etc. The ensemble tree-based models using CAMs have several advantages for classification and regression across several real world applications, but the models may be difficult to optimize for fast runtime without accuracy loss in standard SRAM and memristor based technologies. In addition, the CAM cells (in-SRAM hardware) may suffer from high power consumption, large area requirements and high cost. If decision trees are implemented with shorter trees or fewer trees the accuracy of the decision tree may get effected. However, for some real world applications a range of values may be considered as a match for an input pattern. In some example implementations, a larger number of CAM cells may be utilized to implement a digital CAM for a range of values, which may lead to greater resource consumption. For example, a hardware implementation for accelerating decision tree inference using Field Programmable Gate Arrays (FPGA) may suffer from high power and minimal performance improvements.

An analog CAM ("a-CAM") array circuit searches multilevel voltages and stores analog values in a nonvolatile memory (e.g., memristor). Each analog cell can store a range of values. Hence, each analog cell can implement a function that is equivalent to multiple digital CAM cells, leading to significant advantages in area and power saving in implementing certain CAM-based functions. The a-CAM circuit may be driven with standard multi-level digital values, or directly with analog signals, giving additional potential for increased functionality and removing the need for expensive analog-digital conversion. More particularly, each a-CAM cell outputs a match when an analog input voltage matches a certain range that is defined for the corresponding a-CAM cell.

Examples described herein may relate to a decision tree computation system in which a decision tree is implemented in an analog Content Addressable Memory (a-CAM) array for a decision tree computation system using a hardware accelerator. The hardware accelerator accesses a decision tree to be implemented in the a-CAM array. The decision tree may include multiple paths and each path of the multiple paths may include a set of nodes. Each node of the decision tree may be associated with a feature variable of multiple feature variables of the decision tree. For each path, the hardware accelerator may combine multiple nodes in set of nodes that have the same feature variable into a combined single node. In each path, feature variables which are not being evaluated in the set of nodes of are substituted by a wildcard value. The multiple feature variables are mapped to columns of the a-CAM array and the multiple paths of the decision tree are mapped to rows of the a-CAM array.

Referring now to the figures, FIG. 1 illustrates a decision tree computation system 100. The decision tree computation system 100 includes a processor 102, a hardware accelerator 106, a decision tree 104, a machine-readable medium 108, a-CAM array 110 and a memory 112. The processor 102 may be implemented as one or more microprocessors, microcomputers, microcontrollers, digital signal processors, central processing units, state machines, logic circuitries, and/or any devices that manipulate signals based on operational instructions.

The decision tree 104 may be stored in the memory 112. In an alternate implementation, the decision tree 104 may be stored in a main memory (not shown) of the decision tree computation system 100. The decision tree 104 may be received by the decision tree computation system 100 from an external server or a system. In an alternate implementation, the decision tree 104 may be generated by a compiler (not shown) present in the decision tree computation system 100. The decision trees for implementation may include ensemble tree-based classifiers including, Random Forests (RF), extreme gradient boost trees, etc. The decision tree 104 may be associated with a real world application which has classification feature that are analog or low-precision. Decision trees 104 may be models used to predict event outcomes in real word applications. For example, decision tree models may be associated with predicting a forest fire by evaluating temperature and wind speed. In another example, data related to a person including a person's age/education/income may be evaluated using a decision tree model for credit scoring.

The hardware accelerator 106 may be configured to execute instructions (i.e. programming or software code) stored in the machine-readable medium 108 to perform the functions of the decision tree computation system 100 as described herein. In an example implementation, the exemplary hardware accelerator 106 may include multiple integrated circuits, such as the exemplary integrated circuits. The integrated circuits can include Application-Specific Integrated Circuits (ASICs), Field Programmable Gate Arrays (FPGAs) or other Very Large Scale Integrated circuits (VLSIs). The integrated circuits of the exemplary hardware accelerator 106 may be specifically optimized to perform a discrete subset of computer processing operations, or execute a discrete subset of computer-executable instructions, in an accelerated manner. In FIG. 1, the exemplary hardware accelerator 106 can be configured or manufactured to implement the decision tree 104 on a-CAM array 110 in the memory 112.

The a-CAM array 110 is implemented for the decision tree 104 in the memory 112 using the hardware accelerator 106. The memory 112 is a non-volatile memory built using technologies that include for instance, resistive switching memory (i.e. memristor), phase change memory, magneto-resistive memory, ferroelectric memory, some other resistive random access memory device (Re-RAM), or combinations of those technologies. CAM cells can be implemented in technologies that permit the CAM to hold its contents even when power is lost or otherwise removed. Thus, a CAM's data "persists" and can act as what is known as a "non-volatile memory".

The a-CAM array 110 is a dedicated hardware on which the decision tree 104 is implemented. The a-CAM array 110 is a collection of a-CAM cells storing information of the decision tree 104. The a-CAM array 110 is implemented after reformulating the decision tree 104. The reformulation ensures that the memory density is high and the area used by the a-CAM array 110 for incorporating the information of the decision tree 104 is minimal. More detailed information of reformulation of the decision tree 104 and the implementation of the a-CAM array 110 is presented in FIGS. 4, 5 and 6 in the description below.

Although the decision tree computation system 100 has been shown as a standalone system, it should be understood that the decision tree computation system 100 may be part of an Internet of things (IoT) device or any computing device communicating with a host using network devices.

Figure 2:
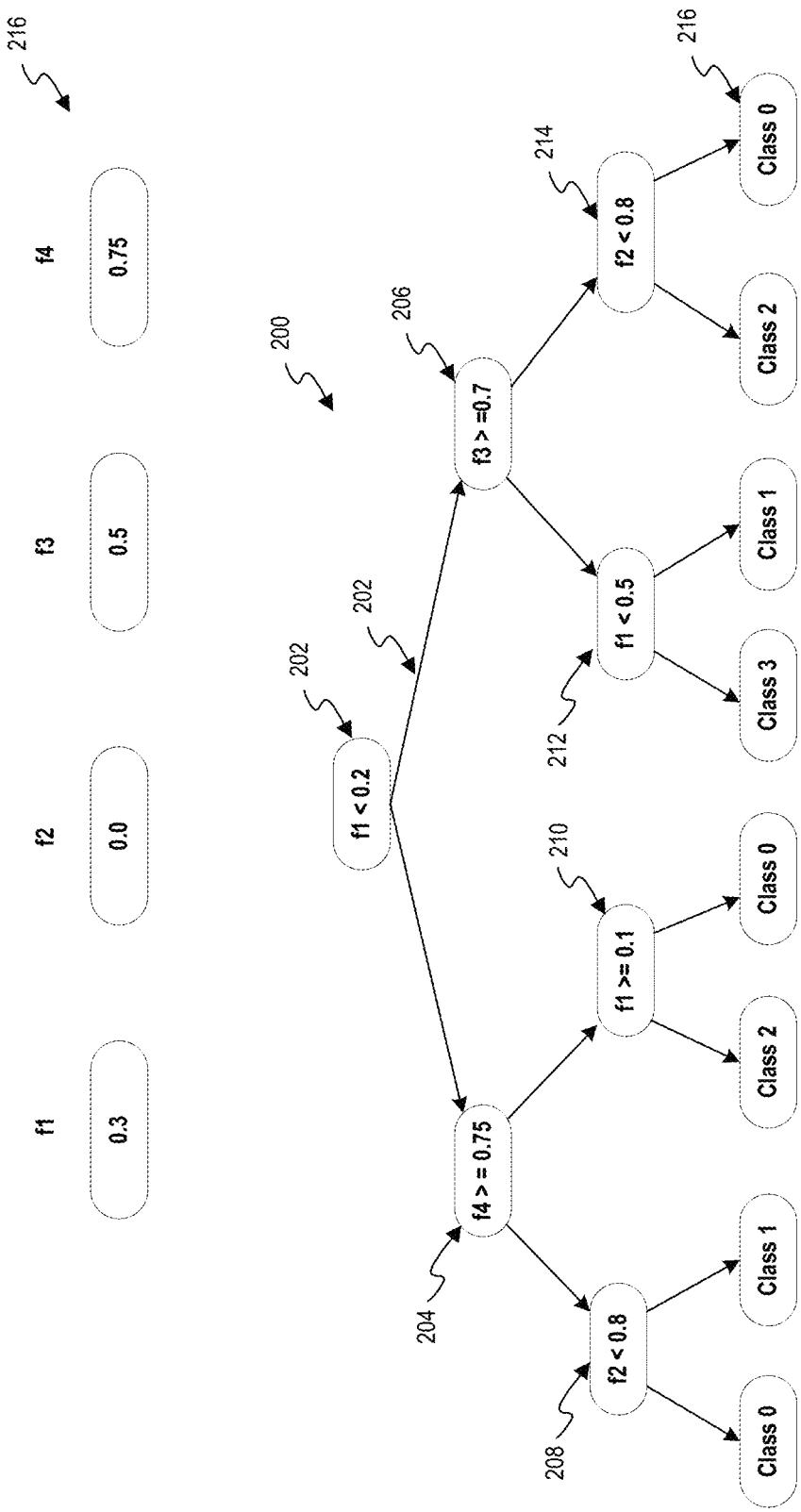
FIG. 2 illustrates an example of a decision tree, in accordance with examples of the present disclosure.

FIG. 2 illustrates an example of a decision tree 200, in accordance with examples of the present disclosure. The decision tree 200 comprises of a root node 202, branches 204, 206, 208, 210, 212, 214; and leaf nodes with classification results (class 0, class 1, class 2, and class 3). The decision tree 200 is traversed from top to bottom. The decision tree 200 has multiple paths and each path includes of a set of nodes beginning with the root node 202 and traversing down the tree 200 until a leaf node is reached. Each node includes a binary threshold of an individual feature variable, according to which the input data under analysis is evaluated to determine whether to branch right or left when proceeding down the tree structure. In some cases, each node may have multiple thresholds for a feature variable. A feature vector comprises of feature variables 216 (f1, f2, f3 and f4) of the data which are being evaluated for classifying the data. At each node an input data is compared to a pre-defined threshold value with the feature variable of the node. Based on this comparison, the node to be evaluated next gets selected in the decision tree 200. For example, an evaluation at node 202 may result in a continuation to branch node 204 or to branch node 206. Thus, beginning at the origin 202, and proceeding until a leaf node is reached, at each branch node, input data related to feature variables 216 is evaluated at each branch node, and traverses to the appropriate subsequent node. Each leaf node represents a data class/classification or characteristic. By traversing the decision tree 200 from the origin node to a leaf node, a determination of a class or characteristic of the input data can be made. The decision tree 200 is accessed by the hardware accelerator 106 from a main memory (not shown in FIG. 1) of the decision tree computation system 100. In some embodiments, the decision tree 200 may be accessed from a server or any other decision tree generation device by the decision tree computation system 100. The length of the each path in the decision tree and the number of number of nodes in each path may be based on user preferences while configuring a decision tree. The number of nodes in each path (depth of decision tree) and the number of feature variables to be evaluated may be based on the data being classified. Although the FIG. 2, shows a simple decision tree for purposes of clarity and conciseness, with three nodes in each path, four feature variables and eight decision paths (trees), it should be noted that decision trees may have significantly higher number nodes, feature variables and decision paths. For example, an object tracking application may use a decision tree with 1,000-20,000 paths, 4-64 nodes in each path and 100-1,000 feature variables. The decision tree may have 100,000 to 20 million nodes.

Figure 3:
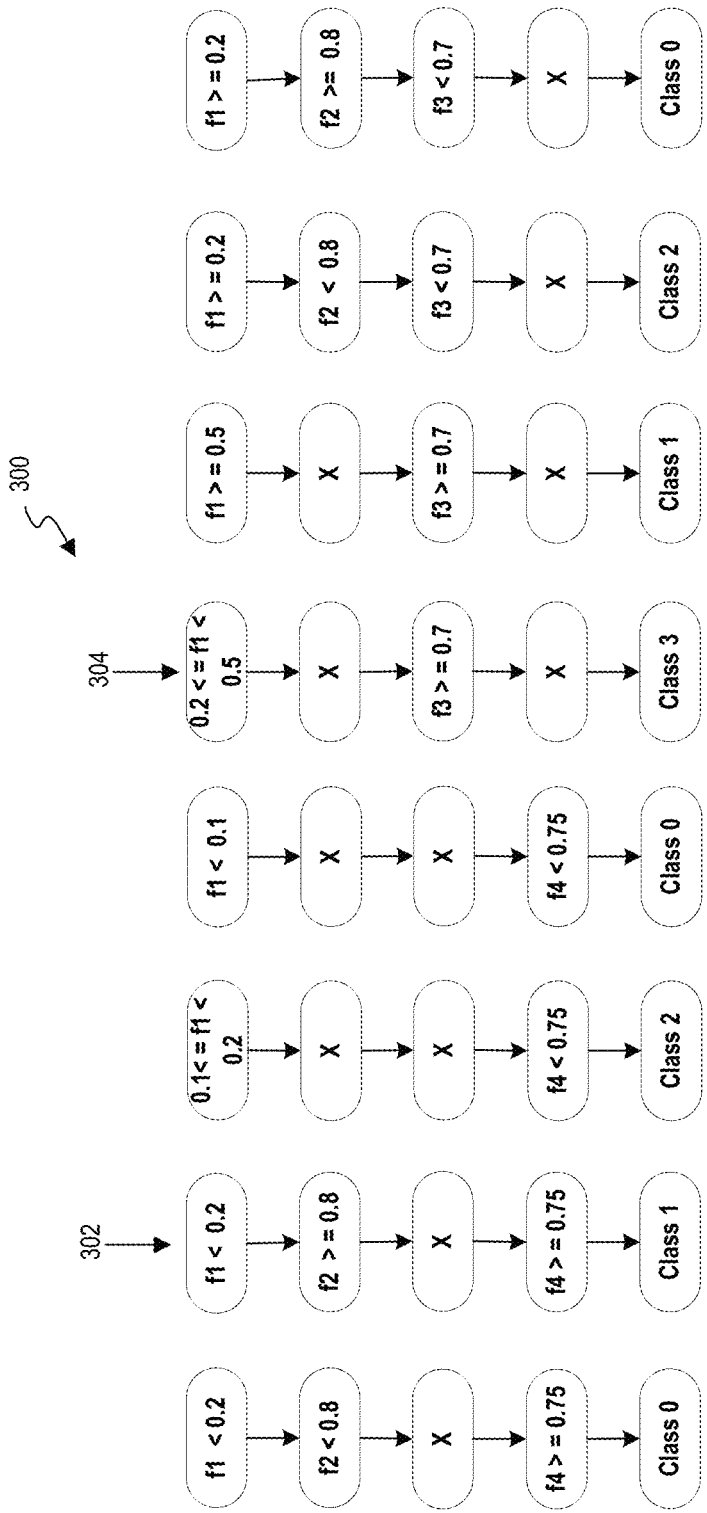
FIG. 3 illustrates a reformulation of the decision tree of FIG. 2, in accordance with examples of the present disclosure.

FIG. 3 illustrates a reformulation of the decision tree 200 of FIG. 2, in accordance with examples of the present disclosure. Each path (root to leaf path) for the decision tree 200 corresponds to a chain of nodes. For example, the chain of nodes 202, 206, 214 and 216 shown in FIG. 2 may be considered as a first path or a first tree in the decision tree 200. In FIG. 3, 302 is a single path of the decision tree 200. When the same feature variable (e.g. f1) is present in multiple nodes of a single path, the two threshold rules for the nodes evaluating on the same feature variable will be combined into a single node. Node feature values (also referred as feature threshold rules) associated with the same feature can be combined. This combining step is performed for each of the feature variables in each path of the decision tree 200. For instance, in FIG. 2, there is a path where the feature variable f1 with two threshold node values (f1<0.2 and f1<0.5) in the root-to-leaf path shown in the fifth column. These two threshold values of f1 can be combined into a single node (0.2<=f1<0.5) in indicated in path 304 in FIG. 3. The single node corresponds to a range of values of a feature variables f1 in the set of nodes of a path of the decision tree 200.

Referring to FIG. 1, hardware accelerator 106 may reorder the set of nodes in each path of the multiple paths. The reordering of the set of nodes in each path organizes the multiple feature variable decision nodes of the decision tree 300 in the same order in each path. The reordered multiple feature variables in the set of nodes in each path corresponds to a sequence of the multiple feature variables mapped to the a-CAM array 110. In FIG. 3 each column shows the multiple feature variables being evaluated in the same order. For example, in the path 302 the order of feature variables being evaluated includes f1 followed by f2, f3 and f4. In path 304, the order of feature variables being evaluated includes feature variables f1 followed by f2, f3 and f4.

In some example implementations, the hardware accelerator 106 may substitute a wildcard value for a feature variable not being evaluated in the set of nodes at each a path of the decision tree 200. The wildcard may be referred to as "don't care" and is represented by an "X". During search of an input pattern in the a-CAM array 400 any cell with "X" will return a match. In FIG. 3, an X indicates a "don't care" node for feature variables not being evaluated in the paths of the decision tree 200. For instance, in the first path (first column of FIG. 3) feature variable f3 is not being evaluated and has been replaced by an "X". The substitution of the wildcard for feature variables not being evaluated and the reordering of the set of nodes in each path allows the reformulated decision tree 300 to be mapped directly to the a-CAM array 400.

Figure 4:
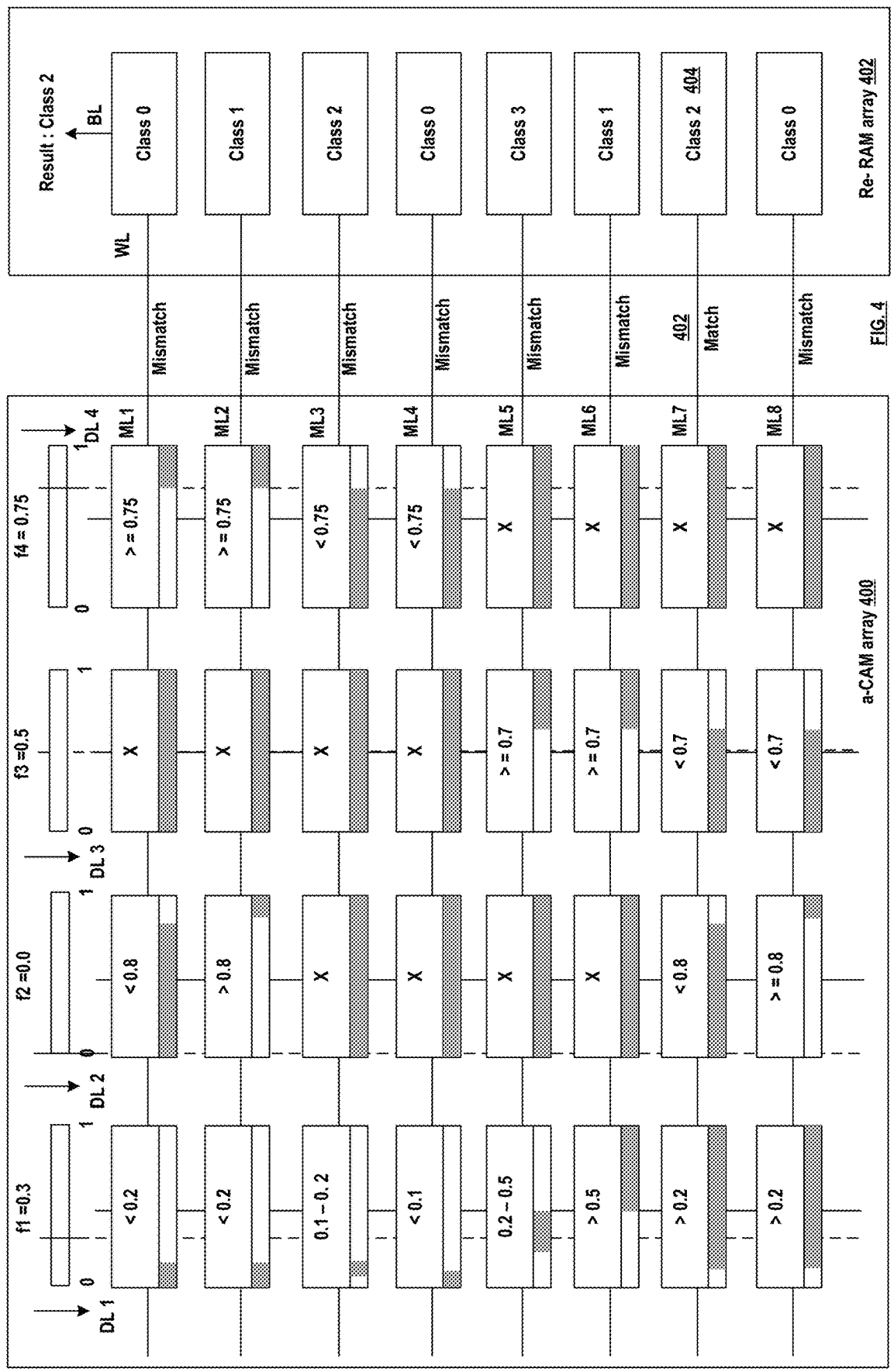
FIG. 4 illustrates an analog-Content Addressable Memory (a-CAM) array used for implementing the decision tree of FIG. 3, in accordance with examples of the present disclosure.

FIG. 4 illustrates the a-CAM array 400 used for implementing the reformulated decision tree 300 of FIG. 3, in accordance with examples of the present disclosure.

One analog CAM cell can implement a function that is equivalent to multiple digital CAM cells, leading to significant advantages in area and power saving in implementing certain CAM-based functions. Unlike digital CAMs in which storing of a range of values requires multiple CAM cells, each a-CAM cell in a-CAM array 400 may be associated with a range of values. Each a-CAM cell circuit encodes a lower and upper bounds of a stored value or range in using memristor conductance. The a-CAM cell indicates a 'match,' only when the search value is within a-CAM cell's programmed range.

Therefore, one CAM cell can be used to store multiple discrete levels and may be a direct functional replacement for multiple digital Ternary CAM (TCAM) cells (e.g. one a-CAM cell may store eight discrete levels) or arbitrary ranges of continuous values. The a-CAM array 400 includes multiple a-CAM cells. The a-CAM array 400 allows programming of multilevel voltages and stores analog values in a nonvolatile memory (e.g., memristor). The a-CAM circuit can be driven with standard multi-level digital values, or directly with analog signals, giving additional potential for increased functionality while removing the need for expensive analog-digital (A/D) conversion. More particularly, the a-CAM cell outputs a match when the analog input voltage matches a certain range that is pre-defined for the a-CAM cell.

The chain of multiple feature variable nodes of each path of the decision tree 300 are mapped to columns of the a-CAM array 400. In an example implementation each column of the a-CAM array 400 is associated with a different feature variable of the decision tree 300. For example, in FIG. 4 the four columns of the a-CAM array 400 are associated with multiple feature variables f1, f2, f3 and f4. In another example implementation, depending on the greater level of precision for a specific feature vector, multiple columns of the a-CAM array may be mapped to a single feature variable.

The hardware accelerator 106 may map each root to leaf path of the decision tree 300 to a row of the a-CAM array 400. Each node evaluating a feature variable in each path the decision tree 300 may receive input from a corresponding data line of the a-CAM array 400. Each a-CAM cell in a row may correspond to a node of a particular path and may be associated with a feature variable. Furthermore, each a-CAM cell may store an analog value or analog range associated with the node's feature threshold. In some examples, the range of values may be a range of continuous values.

The data stored in the a-CAM cells may be queried, e.g. using the data lines DL1-DL4. Although the a-CAM array 400 shown in FIG. 4 is an example 4×8 array, differently sized a-CAM arrays 400 may be used according to the dataset and precision requirements of the decision tree. In some examples, the precision of a decision tree can be increased by adding more feature variables or by increasing the number of paths.

The width of the a-CAM array may be expanded to accommodate additional feature variables. The height of the a-CAM array can be expanded to accommodate additional paths of the decision tree. In some cases, the precision of decision tree is based on the precision of feature variables. For example, certain feature variables may require higher precision. For example, f1 may require higher precision and may require 3 columns of a 3-bit CAM. f2 may be binary and f5 may have five values which are mapped to a 3-bit CAM.

In some cases multiple a-CAM arrays 400 may be combined to accommodate a large decision. The size of the a-CAM array 400 may be based number of paths, features and precision required. For example, a decision tree for identifying traffic signs may include 2,000 nodes with 64 paths and 256 features. Each path is limited to 6 features. To implement this decision tree model 25 individual a-CAM arrays (sized 50×400) may be combined.

Each a-CAM array 400 comprises of a-CAM cells (memory cells) including at least one three-terminal memory device. The three-terminal memory device may be a non-volatile memory device that may be a Field Effect Transistor (FET), such as a Ferroelectric Field Effect Transistor (FeFET). The a-CAM array 400 searches multi-level voltages and stored analog values in the non-volatile memory. One analog cell may implement a function that is equivalent to multiple digital CAM cells, leading to significant advantages in area and power saving.

In an example implementation, the a-CAM array 400 may be driven with standard multi-level digital values, or directly with analog signals, giving additional potential for increased functionality while removing the need for expensive analog-digital conversion. This provides additional potential for increased functionality when removing the need for expensive analog-digital conversion. When the a-CAM cell comprises of memristor based electronic circuitry the power savings may be significant and allows the a-CAM cells to perform generalized computation and other novel application scenarios.

In an example implementation, the a-CAM array 400 may be combined with non-volatile Resistive random-access memory (Re-RAM) cells in a Re-RAM array 402. This type of implementation reduces the overall power consumed by the a-CAM array 400. In comparison to purely digital SRAM-based circuits used in Digital CAMs, the implementation described in FIG. 4 allows larger decision trees to be implemented using the hardware with higher power savings. In addition, the analog CAM array may be used as a substitute for a digital CAM in order to provide relatively higher memory densities and lower power consumption. Applications employing decision making logic may utilize a similar architecture to example a-CAM array 400 for processing to achieve relatively lower power consumption and higher memory density.

Figure 5:
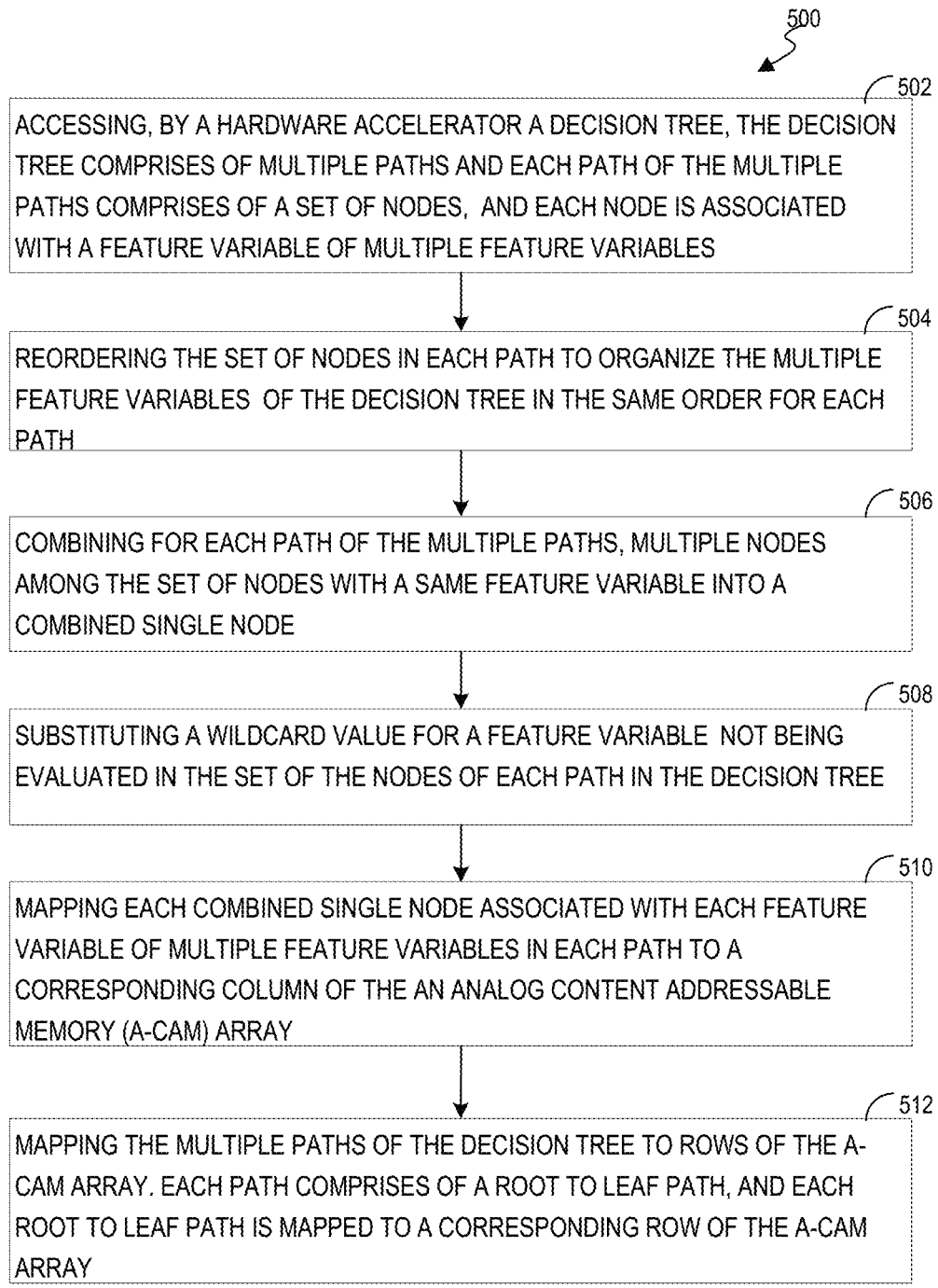
FIG. 5 is an example flow diagram depicting a method for implementing a decision tree in the a-CAM memory array, in accordance with examples of the present disclosure.

FIG. 5 is an example flow diagram depicting a method 500 for implementing a decision tree 300 in the a-CAM memory array 400. In some implementations, one or more blocks of the method 500 may be executed substantially concurrently or in a different order than shown. In some implementations, a method may include more or fewer blocks than are shown. In some implementations, blocks of the method 500 may be combined. The method 500 shown in FIG. 5 may be implemented in the form of executable instructions stored on a machine-readable medium 108 and executed by a processing resource (e.g. such as hardware accelerator 106) and/or in the form of electronic circuitry. In some implementations, the method 500 may be performed by the processor 102 of the decision tree computation system 100.

At block 502, with reference to decision tree computation system 100 of FIG. 1, the hardware accelerator 106 may access a decision tree, e.g. decision tree 200, from the memory 112. In an example implementation, the decision tree 200 may be received from an external computing device and stored in the memory 112 of decision tree computation system 100. The decision tree 200 may have multiple paths and each path may have a set of nodes. At each node a feature variable of the decision tree 200 may be evaluated based on a pre-defined value for the feature variable in the node of a path. The decision tree 200 may have multiple feature variables.

In an example implementation, the decision tree computation system 100 may have a pre-configured decision tree 104 for real world applications. Example real world applications may include any applications employing decision-making logic, e.g. forest fire prediction, credit scoring, medical diagnosis, etc. The decision trees associated with these real world applications may work well without normalization of the feature values as the accuracy level required may be not high. In addition, the decision tree 104 may allow for substitution of missing data using wildcard, handling different types of feature variables and may be resistant to overfitting.

At block 504, the set of nodes in each path may be reordered to organize the multiple feature variables associated with the set of nodes of the decision tree 200. The reordered multiple variable decision nodes in each path corresponds to a sequence of the feature variable mapped to the a-CAM array 400. This type of reordering enables parallel processing of each row of the a-CAM array 400 as the features associated with the nodes in each path may be placed in the same order for each path of the decision tree. Furthermore, each feature variable value from each incoming feature vector may be evaluated by and classified in parallel along the a-CAM cells in a column by traversing each decision tree path in parallel.

At block 506, multiple feature threshold values associated with a fracture variable among the set of nodes in each path may be combined into a single node. This combination of multiple nodes is performed when a same feature is being evaluated at multiple nodes of an individual path. The combined single node is computed by combining feature threshold values of the feature variable at the multiple nodes combined within an individual path. This combining step is done for each path of the decision tree 200. This combination step reduces the a-CAM cells required for implementing the decision tree 300 in the a-CAM array 400.

At block 508, a wildcard value (X) may be substituted for a feature not being evaluated in the set of the nodes in each path of the decision tree 200. The wildcard values indicates that the input will always be considered as a match for a-CAM cell when the "don't care" is implemented in the a-CAM cell. In a-CAM cell, when the range of maximum programming voltage is between Vmin and Vmax, the a-CAM cell is considered as storing a "don't care" condition represented by a value "X".

At block 510, each of the combined single nodes associated with a feature variable may be mapped to a corresponding column of the a-CAM array 400. The combined feature thresholds of the decision tree 300 in the form of combined single nodes are mapped to the corresponding column of the a-CAM array 400. Each a-cam cell in the a-CAM array 400 is configured to store an analog value or an analog range associated with a feature variable of the decision tree 300. Each a-CAM cell in a column of the a-CAM array 400 is associated with a single feature variable. In some examples, each a-CAM cell in a particular column of the a-CAM array 400 may be associated with the same feature variable. In the FIG. 4, each a-CAM cell in the first column of the a-CAM array 400 corresponds to the feature value of the feature variable f1 in a corresponding path of the decision tree 300.

The analog value or analog range to be stored in each a-CAM cell is received via the data line (DL) of the corresponding column. The analog range may be a continuous interval with a lower bound and an upper band. The analog range of each a-CAM cell represents an acceptable range for a match in the node of the decision tree 300. The analog range represents the feature threshold value of a feature variable associated with the node of the decision tree 300. Each value between a "high voltage bound" and a "low voltage bound", or within a range can be considered as a match to an input value. These high and low values are set by programming three-terminal memory devices of the a-CAM cell, which may be referred to as Vhigh and Vlow herein. Vhigh and Vlow set bounds of the range of values that may be stored in the cell such that the cell may store analog values. A memory cell in a-CAM may store any value between the value defined by Vhigh and the value defined by Vlow. If Vhigh=Vmax, where Vmax is the maximum programmable voltage of a three-terminal memory device, and Vlow=Vmin, where Vmin is the minimum programmable voltage of a three-terminal memory device, then the stored value may be represented as an "X".

In addition, each column of the a-CAM array 400 is configured to receive an input value associated with mapped feature variable. The input value is an analog voltage input received via the data lines to the a-CAM cells in the column of the a-CAM array 400. The input value may be mapped to a voltage amplitude applied to the data lines.

At block 512, the method 500 includes mapping of the multiple paths of the decision tree to rows of the a-CAM array. Each root to leaf path of the decision tree 300 with corresponding a set of nodes is mapped to corresponding rows of the a-CAM array 400. Each node of a path is associated with an individual a-CAM cell in the row. The steps performed in block 510 and 512 may be combined and performed simultaneously.

Adding more rows and column to the a-CAM array 400 may increase the level of precision of the classification provided by the decision tree and the level of precision of the feature variables. In addition, large decision trees can be incorporated using multiple a-CAM arrays 400. The expansion of the a-CAM array 400 in width with additional columns may allow feature variables requiring greater precision to be mapped to multiple additional columns. The expansion of the a-CAM array 400 in height may allow the decision tress with large number of branches to implemented using multiple a-CAM arrays.

Figure 6:
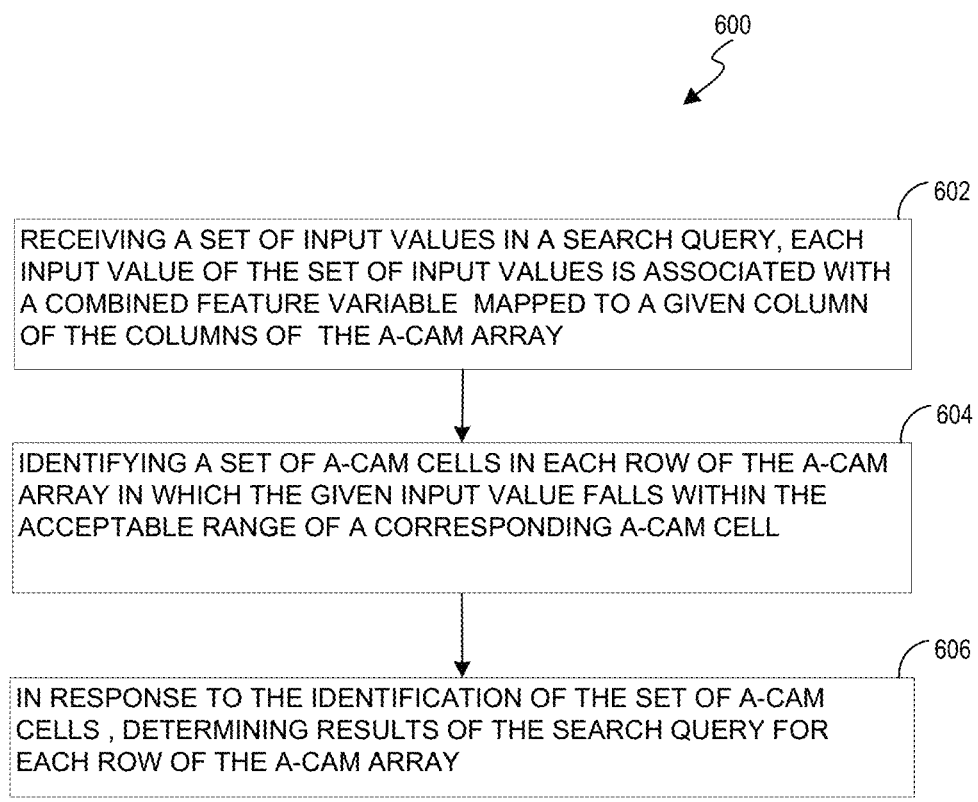
FIG. 6 is a flow diagram depicting a method for processing a query using the a-CAM memory array, in accordance with examples of the present disclosure.

FIG. 6 is an example flow diagram depicting a method 600 for processing a query using the a-CAM memory array 400, in accordance with examples of the present disclosure. In some implementations, one or more blocks of the method 600 may be executed substantially concurrently. In some implementations, a method may include more or fewer blocks than are shown. In some implementations, blocks of the method 600 may be combined. The method 600 shown in FIG. 6 is executed by the a-CAM array 400 when an input pattern with a set of input values is received for classification.

At block 602, a-CAM array 400 may receive an input pattern with a set of input values in a search query. Each input value may be associated with a single feature variable mapped to a corresponding column of the a-CAM array 400. Each input value may be an analog input voltage or a digital value.

In an example implementation, the a-CAM cells in the a-CAM array 400 may be individually searchable over the data lines (DL). Each input value in the set of input values is associated with a feature variable of a feature vector and the a-CAM cells in a column of the a-CAM array 400 may be associated with a same feature variable. The analog input pattern corresponding to the set of input values are loaded into the a-CAM array 400 via a plurality of data lines. In some example, a plurality of search lines are used in lieu of a plurality of data lines. Each a-CAM cell receives the input value over its corresponding data line.

More particularly, each CAM cell outputs a match when the analog input voltage matches a certain range that is defined by the a-CAM cell. Each a-CAM cell performs two analog comparisons: 'greater than' and 'less than.' At each CAM-cell, an input data line voltage is compared to two different analog values at the same time. Large number of input values may be accommodated by a single a-CAM cell by setting value for acceptable voltage using 'greater than' and 'less than. This type of analog comparisons in a single a-CAM cell may significantly reduce processing time and energy consumption in comparison to a digital CAM.

At block 604, a set of a-CAM cells in each row of the a-CAM array 400 in which the input value is within the acceptable range of a corresponding a-CAM cell may be identified. In FIG. 4 for example, the first row of the a-CAM array 400 has four a-CAM cells storing analog ranges associated with feature variables f1, f2, f3 and f4 respectively.

At block 606, the method 600 includes determining results of the search query for each query based on the identification of the set of the a-CAM cells in each row. The results from each row are stored in a Re-RAM array. The results of classification from each row are present over the match line (ML1-8). The comparison results comprises of a match or a mismatch. The result comprises of a match when the set of input values falls within the acceptable ranges of the corresponding a-CAM cells in the corresponding row of the a-CAM array 400. In case of a match, the match line (ML) of the corresponding row remains charged high.

In example FIG. 4, the inputs for the feature variables (f1, f2, f3 and f4) are received through the data lines (DL1 to DL4). The set of input values received at each column of the a-CAM array 400 are shown on top of each column in FIG. 4 (f1=0.3, f2=0.0, f3=0.5 and f4=0.75.) These input values may be mapped to voltages and applied along the data lines. Considering the first row in the a-CAM array 400 and the input values received for each feature variable of the feature variable, it can be observed that in the first a-CAM cell the acceptable range is f1<0.2. The input value (f1=0.3) received at the first a-CAM cells is not within the acceptable range of the first a-CAM cell. However, the input values associated with f2, f3 and f4 fall within the acceptable range of the second, third and fourth a-CAM cell of the first row. The input value received at the a-CAM cell is compared to the stored acceptable range of the a-CAM cell. In example FIG. 4, the input values (f1, f2, f3, and f4) received at the a-CAM cells of the seventh row of the array falls within the acceptable range stored in the a-CAM cells and the result indicates a match on the match line 402. The classification result 402 (Class 2) is provided as an output from the a-CAM array 400 in the decision tree computation system 100.

The classification results may be produced in a single cycle by high speed, low power matching of the input values (analog or digital). Moreover, when the a-CAM array 400 is implemented using memristor based circuitry the operation energy and area required may further be minimized.

Figure 7:
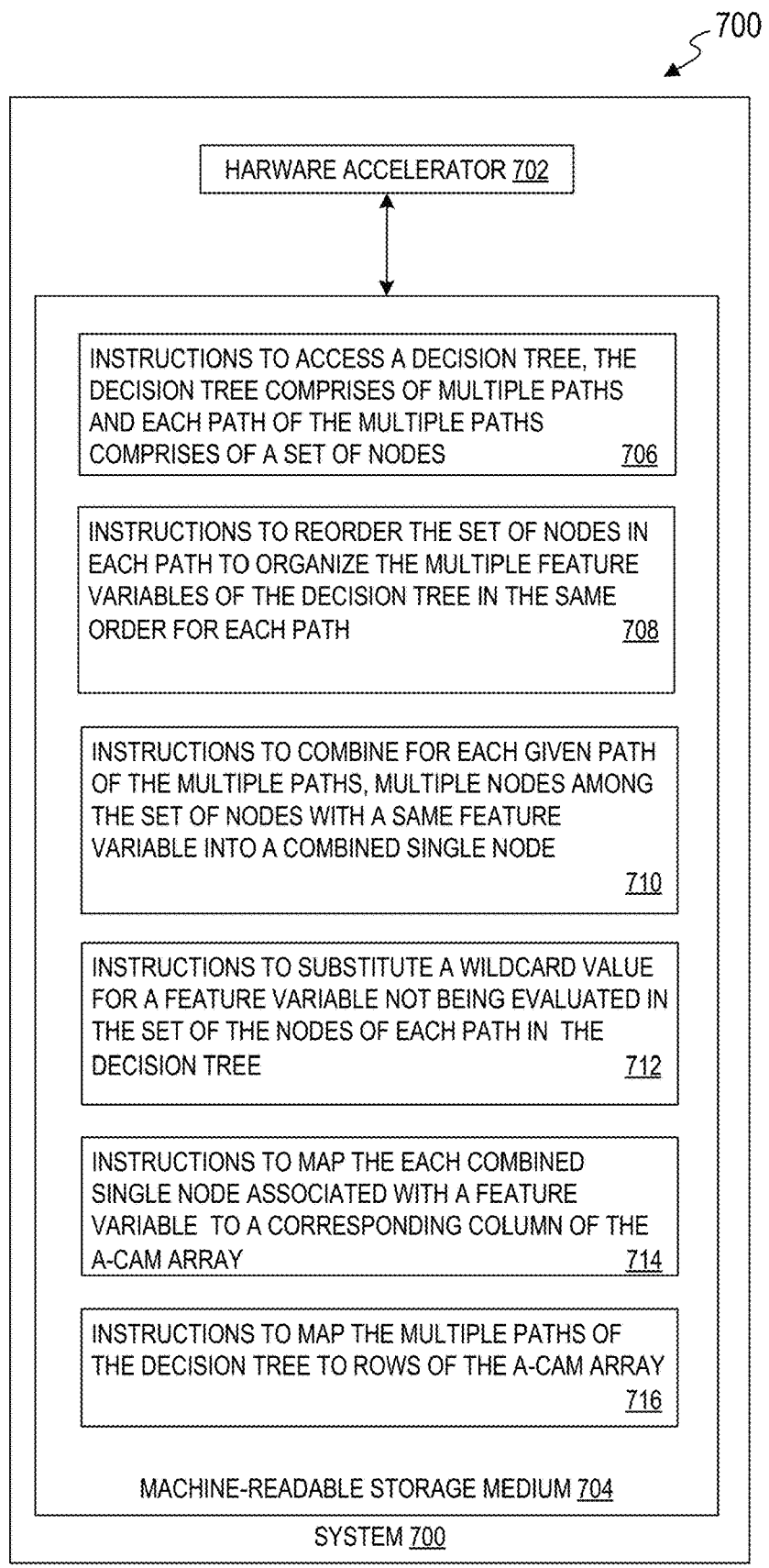
FIG. 7 illustrates an example computing environment, implementing a non-transitory computer-readable medium, according to example of the present disclosure.

FIG. 7 illustrates an example system 700, implementing a non-transitory machine-readable medium 704, according to examples of the present disclosure. The machine-readable storage medium 704 may be utilized by a computing system, such as the system 700. In one implementation, system 700 may include the hardware accelerator 702 communicatively coupled to the machine-readable storage medium 704. The machine-readable storage medium 704 may be, for example, an internal memory device. In one implementation, the machine-readable storage medium 704 includes a set of computer readable instructions, such as instructions corresponding to the hardware accelerator 702. The set of instructions (706, 708, 710, 712, 714, and 716) may be accessed by the hardware accelerator 702 and executed for implementing the a-CAM array 400 in the memory of the system 100.

For example, at block 706, the instructions when executed cause the hardware accelerator 702 to access a decision tree, the decision tree including multiple paths. Each path of the multiple paths comprises of a set of nodes. At each node a feature variable of a feature vector is evaluated using a feature threshold value pre-defined for the node.

At block 708, the instructions when executed cause the hardware accelerator 702 to reorder the set of nodes in each given path to organize the multiple feature variables of the decision tree in the same order for each given path. The feature variables are arranged in the same order in each path.

At block 710, the instructions when executed cause the hardware accelerator 702 to combine for each given path of the multiple paths, multiple nodes among the set of nodes with a same feature variable into a combined single node. The combining step is performed to combine multiple feature threshold values associated with a fracture variable among the set of nodes in each path into a combined single node.

At block 712, the instructions when executed cause the hardware accelerator 702 to substitute a wildcard value for a feature variable not being evaluated in the set of the nodes of each given path in the decision tree.

At block 714, the instructions when executed causes the hardware accelerator 702 to map the multiple feature variables to columns of the a-CAM array.

At block 716, the instructions when executed causes the hardware accelerator 702 to map the multiple paths of the decision tree to rows of the a-CAM array.

In the foregoing description, numerous details are set forth to provide an understanding of the subject matter disclosed herein. However, implementation be practiced without some or all of these details. Other implementations may include modifications, combinations, and variations from the details discussed above. It is intended that the following claims cover such modifications and variations.

What is claimed is:

1. A method for decision tree computation, the method comprising:
    accessing, by a hardware accelerator, a decision tree, wherein the decision tree comprises of multiple paths and each path of the multiple paths comprises of a set of nodes, and wherein each node of the set of nodes is associated with a feature variable of multiple feature variables in the decision tree;
    combining, by the hardware accelerator, for each path of the multiple paths, multiple nodes among the set of nodes with a same feature variable into a combined single node, and wherein each combined single node is associated with a feature variable of the multiple feature variables;
    substituting, by the hardware accelerator, a wildcard value for a feature variable not being evaluated in the set of the nodes of each path of the multiple paths in the decision tree path;
    mapping, by the hardware accelerator, each combined single node associated with each feature variable of multiple feature variables in each path to a corresponding column of an analog Content Addressable Memory (a-CAM) array, wherein the a-CAM array comprises of a-CAM cells, and wherein each a-CAM cell stores at least one of an analog range or an analog threshold value associated with a given feature variable of the multiple feature variables, and wherein the given feature variable matches the feature variable mapped to a corresponding column of the a-CAM array; and
    mapping, by the hardware accelerator, the multiple paths of the decision tree to rows of the a-CAM array, wherein each path of the multiple paths comprises a root to leaf path associated with the set of nodes, and wherein each root to leaf path is mapped to a corresponding row of the a-CAM array.

2. The method of claim 1, wherein combining multiple nodes among the set of nodes with a same feature variable into a combined single node comprises combining, for each path of the multiple paths in the decision tree, multiple feature threshold values associated with at least one feature variable of the multiple feature variables across the set of nodes in each path into a combined single node.

3. The method of claim 1, wherein prior to mapping each combined single node associated with each feature variable of multiple feature variables to a corresponding column of the a-CAM array, the method comprises reordering the set of nodes in each path, wherein the reordering of the set of nodes organizes the multiple feature variables of the decision tree in a same order for each path, and wherein the reordered multiple feature variables associated with a set of nodes in each path corresponds to a sequence of feature variables mapped to columns of the a-CAM array.

4. The method of claim 1, wherein each stored analog range in each a-CAM cell comprises a continuous interval with a lower bound and an upper bound representing an acceptance range for a match, wherein each stored analog range of the a-CAM cell is a feature threshold value of a feature variable.

5. The method of claim 4, wherein each stored analog range in each a-CAM cell of each row in the a-CAM array is an acceptable range associated with a feature variable associated with a given node of the set of nodes in each path of the multiple paths of the decision tree, and wherein each feature variable is assigned at least one of a binary threshold or multiple thresholds at the given node.

6. The method of claim 1, the method further comprising:
    receiving, at the a-CAM array, a set of input values in a search query, wherein each given input value of the set of input values is associated with a combined feature variable mapped to a given column of the columns of the a-CAM array;
    identifying a set of a-CAM cells in each row of the a-CAM array in which the given input value falls within the acceptable range of a corresponding a-CAM cell; and
    in response to the identification of the set of a-CAM cells, determining results of the search query for each row of the a-CAM array.

7. The method of claim 6, wherein a result of the search query comprises a match when the set of input values falls within the acceptable ranges of corresponding a-CAM cells in a single row of the a-CAM array.

8. The method of claim 6, wherein identifying a set of a-CAM cells in each row of the a-CAM array in which the given input values falls within the acceptable range of a corresponding a-CAM cell comprises comparing the input value received at a-CAM cells with the analog range stored in the a-CAM cells, wherein each a-CAM cell receives the input value from a corresponding data line of the a-CAM array.

9. A system for implementing a decision tree comprising:
a hardware accelerator;
a machine-readable medium storing instructions that, when executed by the hardware accelerator, causes the hardware accelerator to:
  access a decision tree, wherein the decision tree comprises of multiple paths and each path of the multiple paths comprises of a set of nodes, and wherein each node of the set of nodes is associated with a feature variable of multiple feature variables in the decision tree;
  combine for each path of the multiple paths, multiple nodes among the set of nodes with a same feature variable into a combined single node, and wherein each combined single node is associated with a feature variable of the multiple feature variables;
  substitute a wildcard value for a feature variable not being evaluated in the set of the nodes of the each path of the multiple paths in the decision tree;
  map, each combined single node associated with each feature variable of the multiple feature variables in each path to a corresponding column of an analog Content Addressable Memory (a-CAM) array, wherein the a-CAM array comprises of a-CAM cells, and wherein each a-CAM cell stores at least one of an analog range or an analog threshold value associated with a given feature variable of the multiple feature variables, and wherein the given feature variable matches the feature variable mapped to a corresponding column of the a-CAM array; and
  map the multiple paths of the decision tree to rows of the a-CAM array, wherein each path of the multiple paths comprises of a root to leaf path associated with the set of nodes, and wherein each root to leaf path of each path is mapped to a corresponding row of the a-CAM array.

10. The system of claim 9, wherein the a-cam cells comprises of memristor based a-CA M circuitry.

11. The system of claim 9, wherein the hardware accelerator is further configured to combine, for each path of the multiple paths in the decision tree, multiple feature threshold values associated with at least one feature variable of the multiple feature variables across the set of nodes in each path into a combined single node.

12. The system of claim 9, wherein prior to mapping each combined single node associated with each feature variable of multiple feature variables to a corresponding column of the a-CAM array, the hardware accelerator is configured to:
  reorder the set of nodes in each path of the multiple paths, wherein the reordering of the set of nodes organizes the multiple feature variables of the decision tree in a same order for each path, and wherein the reordered multiple feature variables associated with a set of nodes in each path corresponds to a sequence multiple feature variables mapped to columns of the a-CAM array.

13. The system of claim 9, wherein each stored analog range in each a-CAM cell comprises a continuous interval with a lower bound and an upper bound representing an acceptance range for a match, wherein each stored analog range of an a-CAM cell is a feature threshold value of a feature variable.

14. The system of claim 13, wherein each stored analog range in each a-CAM cell of each row in the a-CAM array is an acceptable range associated with a feature variable of a given node of the set of nodes in each path of the multiple paths of the decision tree, wherein each feature variable is assigned at least one of a binary threshold or multiple thresholds at the given node.

15. The system of claim 9, wherein the a-CAM array is configured to:
  receive a set of input values in a search query, wherein each given input value of the set of input values is associated with a combined feature variable mapped to a given column of the columns of the a-CAM array;
  identify a set of a-CAM cells in each row of the a-CAM array in which the given input values falls within the acceptable range of a corresponding a-CAM cell; and
  in response to the identification of the set of a-CAM cells, determine results of the search query for each row of the a-CAM array.

16. The system of claim 15, wherein results of the search query comprises a match when the set of input values falls within the acceptable ranges of corresponding a-CAM cells in a single row of the a-CAM array and wherein the results of the search query from each row is stored in a Re-RAM array in a non-volatile memory.

* * * * *